(12) United States Patent
Furumiya et al.

(10) Patent No.: US 7,986,026 B2
(45) Date of Patent: Jul. 26, 2011

(54) SEMICONDUCTOR DEVICE INCLUDING METAL-INSULATOR-METAL CAPACITOR ARRANGEMENT

(75) Inventors: Masayuki Furumiya, Kanagawa (JP); Kuniko Kikuta, Kanagawa (JP); Ryota Yamamoto, Kanagawa (JP); Makoto Nakayama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/707,121

(22) Filed: Feb. 17, 2010

(65) Prior Publication Data

US 2010/0148307 A1     Jun. 17, 2010

Related U.S. Application Data

(62) Division of application No. 11/247,296, filed on Oct. 12, 2005, now Pat. No. 7,705,422.

(30) Foreign Application Priority Data

Oct. 22, 2004     (JP) ................................ 2004-307664

(51) Int. Cl.
   *H01L 21/02* (2006.01)
(52) U.S. Cl. ................................ 257/532; 257/E27.048
(58) Field of Classification Search .................. 257/532, 257/E29.343, E27.048; 361/306.3
   See application file for complete search history.

(56) References Cited

U.S. PATENT DOCUMENTS

| | | | |
|---|---|---|---|
| 4,827,262 A * | 5/1989 | Kumamoto et al. ......... 341/158 |
| 5,583,359 A * | 12/1996 | Ng et al. ...................... 257/306 |
| 6,297,524 B1 | 10/2001 | Vathulya et al. |
| 6,507,272 B1 | 1/2003 | Nicholson et al. |
| 6,674,338 B2 | 1/2004 | Novak |
| 6,690,570 B2 | 2/2004 | Hajimiri et al. |
| 6,717,193 B2 * | 4/2004 | Olewine et al. ............. 257/295 |
| 6,743,671 B2 | 6/2004 | Hu et al. |
| 6,822,312 B2 | 11/2004 | Sowlati et al. |
| 6,980,414 B1 * | 12/2005 | Sutardja ................... 361/306.3 |
| 7,013,436 B1 | 3/2006 | Morton et al. |
| 7,034,396 B2 * | 4/2006 | Yajima ........................ 257/728 |
| 7,572,624 B2 * | 8/2009 | Gumbrecht et al. ....... 435/287.2 |

FOREIGN PATENT DOCUMENTS

| | | |
|---|---|---|
| CN | 1459123 A | 11/2003 |
| CN | 1518106 A | 8/2004 |
| JP | 2004-241762 | 8/2004 |

* cited by examiner

*Primary Examiner* — Matthew C Landau
*Assistant Examiner* — Sun M Kim
(74) *Attorney, Agent, or Firm* — Young & Thompson

(57) ABSTRACT

A semiconductor device has a semiconductor substrate, a multi-layered wiring construction formed over the semiconductor device, and a metal-insulator-metal (MIM) capacitor arrangement established in the multi-layered wiring construction. The MIM capacitor arrangement includes first, second, third, fourth, fifth, and sixth electrode structures, which are arranged in order in parallel with each other at regular intervals. The first, second, fifth and sixth electrode structures are electrically connected to each other so as to define a first capacitor, and the third and fourth electrode structures are electrically connected to each other so as to define a second capacitor.

5 Claims, 10 Drawing Sheets

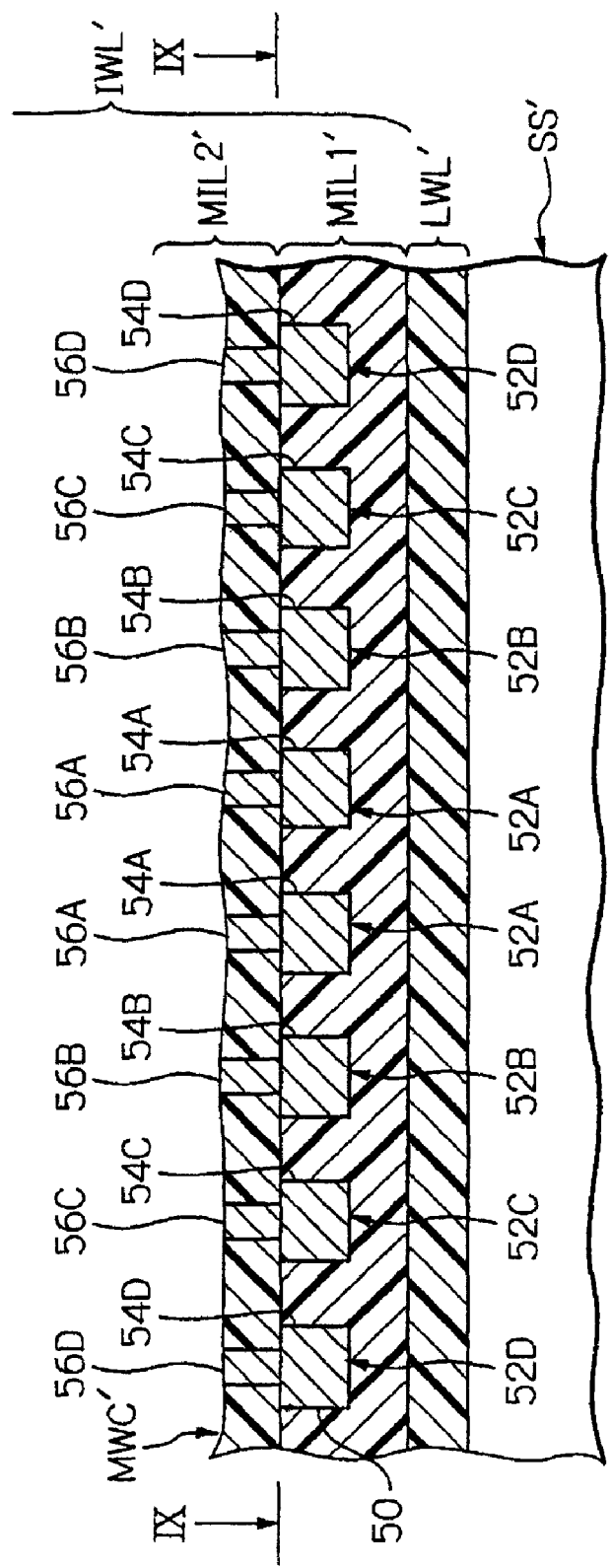

SEMICONDUCTOR DEVICE INCLUDING METAL-INSULATOR-METAL CAPACITOR ARRANGEMENT

BACKGROUND OF THE INVENTION

1. Field of the Invention

The present invention relates to a semiconductor device including a metal-insulator-metal (MIM) capacitor arrangement.

2. Description of the Related Art

In a representative process of producing a plurality of semiconductor devices, for example, a silicon wafer is prepared, and a surface of the silicon wafer is sectioned into a plurality of semiconductor chip areas which are defined by grid-like scribe lines formed in the silicon wafer. Then, the silicon wafer is processed by various well-known methods such that each of the semiconductor chip areas is produced as a semiconductor device, and a multi-layered wiring construction is formed over each of the semiconductor devices. Thereafter, the silicon wafer is subjected to a dicing process such that the plurality of semiconductor devices (i.e. bare chips) are individually cut and separated from each other.

When various integrated circuits, such as analog-to-digital (A/D) converters, digital-to-analog (D/A) converters, sample-and-hold circuits, and so on, are incorporated in each of the semiconductor devices on the silicon wafer, an arrangement of capacitors featuring a large capacitance must be established in the multi-layered wiring construction, because the large-capacitance capacitors are essential elements in the aforesaid various integrated circuits. As the large-capacitance capacitor, a metal-insulator-metal (MIM) capacitor is known in this field, as disclosed in, for example, JP-2004-511899.

The MIM capacitor includes plural pairs of electrode structures formed in a dielectric material of the multi-layered wiring construction. The electrode structures are substantially identical to each other, and are arranged in parallel with each other at regular intervals. Each of the electrode structures includes strip-like metal layers formed in respective insulating interlayers forming the multi-layered wiring construction, and via plugs formed in each of the insulating interlayers to thereby electrically connect the strip-like metal layers to each other. The two electrode structures in each pair define a capacitor, and then these capacitors are further connected in parallel to thereby define a large-capacitance capacitor.

When an MIM capacitor arrangement, including at least two large-capacitance capacitors or MIM capacitors, is established in the to multi-layered wiring construction, it is necessary to carry out the establishment of the MIM capacitor arrangement such that capacitances of the two MIM capacitors conform with each other as much as possible, before a proper operation of the aforesaid various integrated circuits can be ensured. Nevertheless, it is very difficult or impossible to obtain the conformity between the capacitances of the MIM capacitors, because the establishment of the MIM capacitor arrangement is inevitably subjected to process fluctuations, as stated in detail hereinafter.

SUMMARY OF THE INVENTION

Therefore, an object of the present invention is provided a semiconductor device including a metal-insulator-metal (MIM) capacitor arrangement, which is constituted such that an influence of process fluctuations can be eliminated as much as possible.

In accordance with a first aspect of the present invention, there is provided a semiconductor device comprising a semiconductor substrate, a multi-layered wiring construction formed over the semiconductor substrate, and an MIM capacitor arrangement established in the multi-layered wiring construction, wherein the MIM capacitor arrangement includes first, second, third, fourth, fifth and sixth electrode structures, which are arranged in order in parallel with each other at regular intervals, the first, second, fifth and sixth electrode structures being electrically connected to each other so as to define a first capacitor, the third and fourth electrode structures being electrically connected to each other so as to define a second capacitor.

Each of the first, second, third, fourth, fifth, and sixth electrode structures may include at least one strip-like metal layer which is formed in an insulating interlayer included in the multi-layered wiring construction. Also, each of the first, second, third, fourth, fifth, and sixth electrode structures may include at least two strip-like metal layers, which are formed in respective insulating interlayers included in the multi-layered wiring construction, and which are electrically connected to each other.

Preferably, the first and fifth electrode structures are connected to each other with a first conductive line having a first node, the second and sixth electrode structures are connected to each other with a second conductive line having a second node, the third electrode structure is connected to a third conductive line having a third mode, and the fourth electrode structure is connected to a fourth conductive line having a fourth mode, whereby it is possible to independently apply voltages to the first, second, third and fourth nodes. When a high voltage and a low voltage are applied to the respective first and second nodes, it is preferable to apply a low voltage and a high voltage to the respective third and fourth nodes. Also, when a low voltage and a high voltage are applied to the respective first and second nodes, it is preferable to apply a high voltage and a low voltage to the respective third and fourth nodes. Thus, it is possible to effectively suppress production of parasitic capacitance in the MIM capacitor arrangement.

In accordance with a second aspect of the present invention, there is provided a semiconductor device comprising a semiconductor substrate, a multi-layered wiring construction formed over the semiconductor substrate, and an MIM capacitor arrangement established in the multi-layered wiring construction, wherein the MIM capacitor arrangement includes first, second and third pairs of electrode structures, which are arranged in order in parallel with each other at regular intervals, the first and third pairs of electrode structures being electrically connected to each other in parallel so as to define a first capacitor, the second pair of electrode structures being connected to each other so as to define a second capacitor.

In this second aspect of the present invention, each of the electrode structures may include at least one strip-like metal layer which is formed in an insulating interlayer included in the multi-layered wiring construction. Also, each of the electrode structures may include at least two strip-like metal layers, which are formed in respective insulating interlayers included in the multi-layered wiring construction, and which are electrically connected to each other.

Preferably, the first pair of electrode structures are connected to respective first and second conductive lines having first and second nodes, the third pair of electrode structures are connected to the respective first and second conductive lines having the first and second nodes, and the second pair of electrode structures are connected to respective third and fourth conductive lines having third and fourth nodes, whereby it is possible to independently apply voltages to the first, second, third and fourth nodes.

Preferably, the electrode structure, included in the first pair of electrode structures, which is connected to the second conductive line, is adjacent to the electrode structure, included in the second pair of electrode structures, which is connected to the third conductive line, and the electrode structure, included in the second pair of electrode structures, which is connected to the fourth conductive line, is adjacent to the electrode structure, included in the third pair of electrode structures, which is connected to the second conductive line. In this case, when a high voltage and a low voltage are applied to the respective first and second nodes, it is preferable to apply a low voltage and a high voltage to the respective third and fourth nodes. Also, when a low voltage and a high voltage are applied to the respective first and second nodes, it is preferable to apply a high voltage and a low voltage to the respective third and fourth nodes. Thus, it is possible to effectively suppress production of parasitic capacitance in the MIM capacitor arrangement.

In accordance with a third aspect of the present invention, there is provided a semiconductor device comprising, a semiconductor substrate, a multi-layered wiring construction formed over the semiconductor substrate, and an MIM capacitor arrangement established in the multi-layered wiring construction, wherein the MIM capacitor arrangement includes first and second pairs of meandering electrode structures, the first and second pairs of meandering electrode structures being arranged in order so as to maintain a parallel relationship with respect to each other, and being spaced from each other at regular intervals.

In this third aspect of the present invention, each of the meandering electrode structures may include at least one meandering metal layer which is formed in an insulating interlayer included in the multi-layered wiring construction. Also, each of the meandering electrode structures may include at least two meandering metal layers, which are formed in respective insulating interlayers included in the multi-layered wiring construction, and which are electrically connected to each other.

Preferably, the first pair of meandering electrode structures are connected to respective first and second conductive lines having first and second nodes, and the second pair of meandering electrode structures are connected to the respective first and second conductive lines having the first and second nodes, whereby it is possible to independently apply voltages to the first, second, third and fourth nodes.

Preferably, the meandering electrode structure, included in the first pair of meandering electrode structures, which is connected to the second conductive line, is adjacent to the meandering electrode structure, included in the second pair of meandering electrode structures, which is connected to the third conductive line. In this case, when a high voltage and a low voltage are applied to the respective first and second nodes, it is preferable to apply a low voltage and a high voltage to the respective third and fourth nodes. Also, when a low voltage and a high voltage are applied to the respective first and second nodes, it is preferable to apply a high voltage and a low voltage to the respective third and fourth nodes. Thus, it is possible to effectively suppress production of parasitic capacitance in the MIM capacitor arrangement.

BRIEF DESCRIPTION OF THE DRAWINGS

The above object and other objects will be more clearly understood from the description set forth below, with reference to the accompanying drawings, wherein:

FIG. 10 is cross-sectional view taken along the X-X line of FIG. 9.

DESCRIPTION OF THE PREFERRED EMBODIMENTS

Before descriptions of embodiments of the present invention, for better understanding of the present invention, prior arts of a semiconductor device including a metal-insulator-metal (MIM) capacitor arrangement will be now explained with references FIGS. 1, 2, 3, 4A and 4B below.

Figure 1:
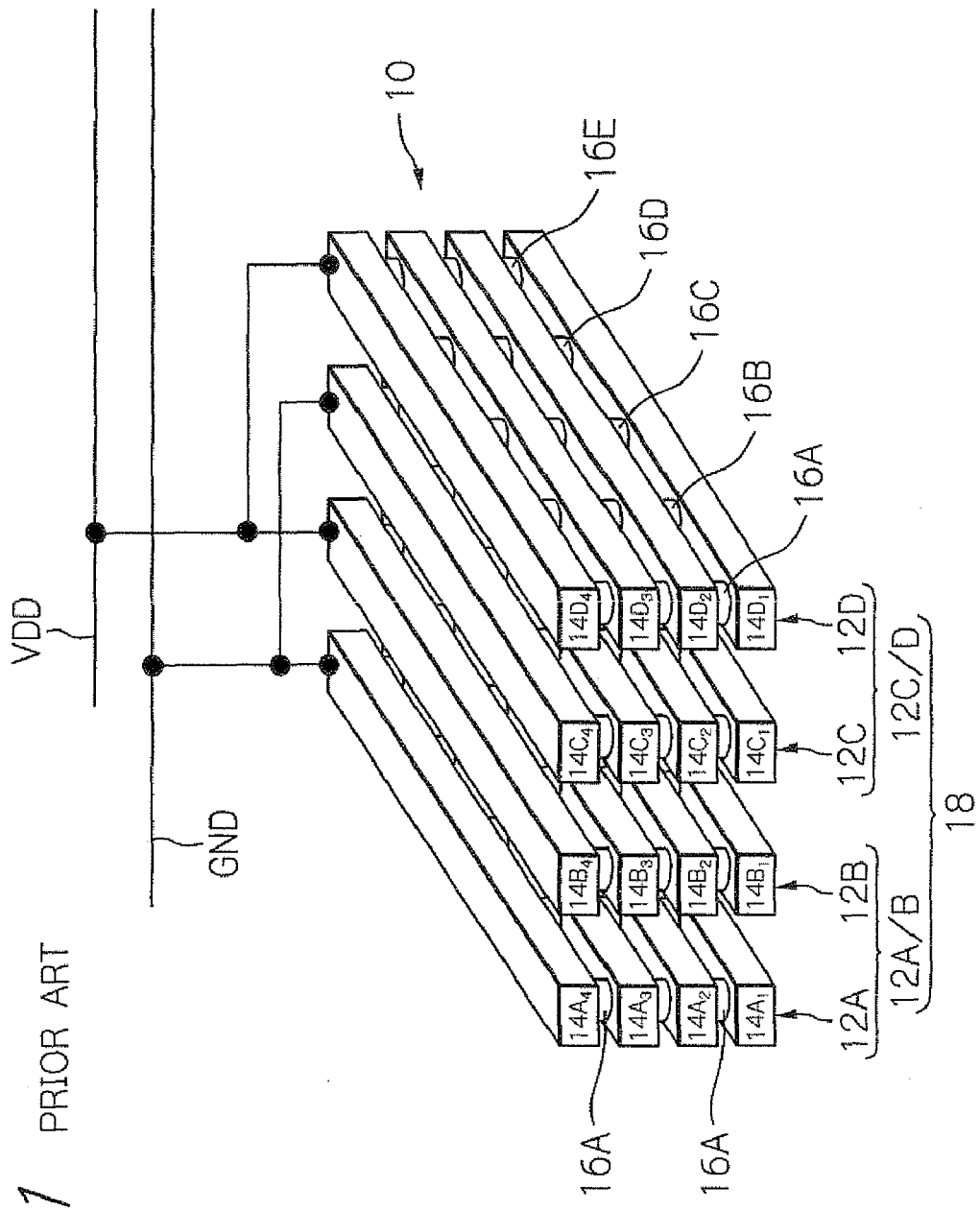
FIG. 1 is a schematic perspective view of a first prior art metal-insulator-metal (MIM) capacitor arrangement.

FIG. 1 shows a first prior art MIM capacitor arrangement, as disclosed in JP-2004-511899.

This first prior art MIM capacitor arrangement, generally indicated by reference 10, includes two pairs of electrode structures: a first pair of electrode structures 12A and 12B; and a second pair of electrode structures 12C and 12D. Although not illustrated in FIG. 1, the first prior art MIM capacitor arrangement 10 is established in an insulator material of a multi-layered wiring construction which is formed over a semiconductor device produced in a chip area on a silicon wafer, with the insulator material forming insulating interlayers of the multi-layered wiring construction.

The electrode structures 12A, 12B, 12C and 12D are substantially identical to each other, and are arranged in parallel with each other at regular intervals.

The electrode structure 12A includes four strip-like metal layers $14A_1$, $14A_2$, $14A_3$ and $14A_4$ formed in the respective insulating interlayers, and via plugs 16A, 16B, 16C, 16D and 16E formed in each of the insulating interlayers (except for the lowermost insulating interlayer) so as to electrically connect the strip-like metal layers $14A_1$, $14A_2$, $14A_3$ and $14A_4$ to each other.

The electrode structure 12B includes four strip-like metal layers $14B_1$, $14B_2$, $14B_3$ and $14B_4$ formed in the respective insulating interlayers, and via plugs 16A, 16B, 16C, 16D and 16E formed in each of the insulating interlayers (except for the lowermost insulating interlayer) so as to electrically connect the strip-like metal layers $14B_1$, $14B_2$, $14B_3$ and $14B_4$ to each other.

The electrode structure 12C includes four strip-like metal layers $14C_1$, $14C_2$, $14C_3$ and $14C_4$ formed in the respective insulating interlayers, and via plugs 16A, 16B, 16C, 16D and 16E formed in each of the insulating interlayers (except for the lowermost insulating interlayer) so as to electrically connect the strip-like metal layers $14C_1$, $14C_2$, $14C_3$ and $14C_4$ to each other.

The electrode structure 12D includes four strip-like metal layers $14D_1$, $14D_2$, $14D_3$ and $14D_4$ formed in the respective insulating interlayers, and via plugs 16A, 16B, 16C, 16D and 16E formed in each of the insulating interlayers (except for the lowermost insulating interlayer) so as to electrically connect the strip-like metal layers strip-like metal layers $14D_1$, $14D_2$, $14D_3$ and $14D_4$ to each other.

As shown in FIG. 1, the first pair of electrode structures 12A and 12B are electrically connected to a ground line GND and a power supply line VDD so as to define a first capacitor 12A/B. Similarly, the second pair of electrode structures 12C and 12D are electrically connected to the ground line GND and the power supply line VDD so as to define a second capacitor 12C/D. The first and second capacitors 12A/B and 12C/D are electrically connected in parallel to the ground line GND and the power supply line VDD so that an MIM capacitor or large-capacitance capacitor 18 is defined. Namely, the large-capacitance capacitor 18 features a capacitance which is equivalent to the sum of capacitances of both the first and second capacitors 12A/B and 12C/D.

Figure 2:
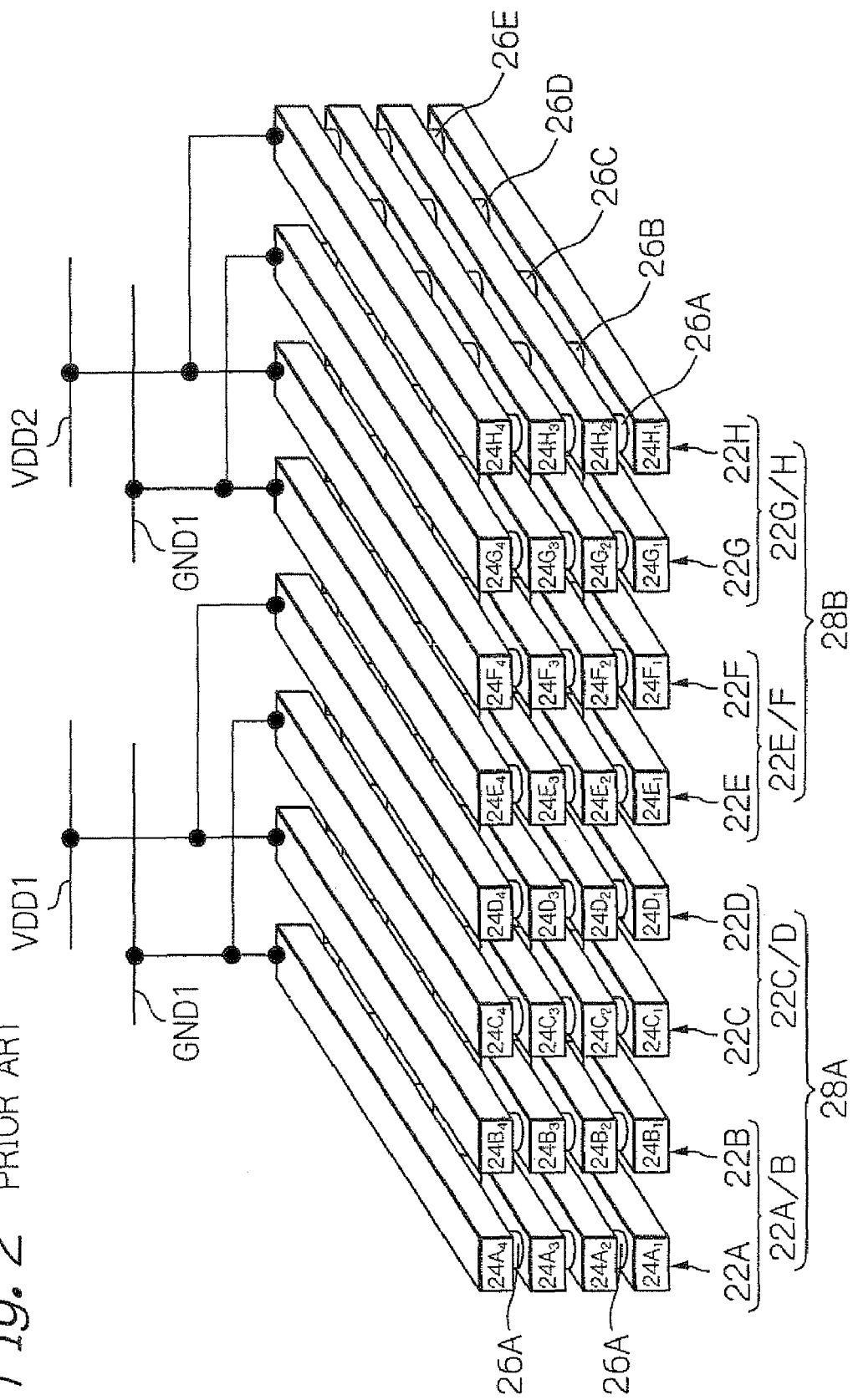
FIG. 2 is a schematic perspective view of a second prior art MIM capacitor arrangement including two MIM capacitors.

FIG. 2 shows a second prior art MIM capacitor arrangement including two MIM capacitors.

The second prior art MIM capacitor arrangement, generally indicated by reference 20, includes four pairs of electrode structures: a first pair of electrode structures 22A and 22B; a second pair of electrode structures 22C and 22D, a third pair of electrode structures 22E and 22F, and a fourth pair of electrode structures 22G and 22H. Similar to the first prior art MIM capacitor arrangement 10, the MIM capacitor arrangement 20 is established in an insulator material of a multi-layered wiring construction which is formed over a semiconductor device produced in a chip area on a silicon wafer, with the insulator material forming insulating interlayers of the multi-layered wiring construction.

The electrode structures 22A, 22B, 22C, 22D, 22E, 22F, 22G and 22H are substantially identical to each other, and are arranged in parallel with each other at regular intervals.

The electrode structure 22A includes four strip-like metal layers $24A_1$, $24A_2$, $24A_3$ and $24A_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24A_1$, $24A_2$, $24A_3$ and $24A_4$ to each other.

The electrode structure 22B includes four strip-like metal layers $24B_1$, $24B_2$, $24B_3$ and $24B_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24B_1$, $24B_2$, $24B_3$ and $24B_4$ to each other.

The electrode structure 22C includes four strip-like metal layers $24C_1$, $24C_2$, $24C_3$ and $24C_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24C_1$, $24C_2$, $24C_3$ and $24C_4$ to each other.

The electrode structure 22D includes four strip-like metal layers $24D_1$, $24D_2$, $24D_3$ and $24D_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24D_1$, $24D_2$, $24D_3$ and $24D_4$ to each other.

The electrode structure 22E includes four strip-like metal layers $24E_1$, $24E_2$, $24E_3$ and $24E_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24E_1$, $24E_2$, $24E_3$ and $24E_4$ to each other.

The electrode structure 22F includes four strip-like metal layers $24F_1$, $24F_2$, $24F_3$ and $24F_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24F_1$, $24F_2$, $24F_3$ and $24F_4$ to each other.

The electrode structure 22G includes four strip-like metal layers $24G_1$, $24G_2$, $24G_3$ and $24G_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24G_1$, $24G_2$, $24G_3$ and $24G_4$ to each other.

The electrode structure 22H includes four strip-like metal layers $24H_1$, $24H_2$, $24H_3$ and $24H_4$ formed in the respective insulating interlayers, and via plugs 26A, 26B, 26C, 26D and 26E formed in each of the insulating interlayers (except for the lowermost insulating interlayer) so as to electrically connect the strip-like metal layers $24H_1$, $24H_2$, $24H_3$ and $24H_4$ to each other.

As shown in FIG. 2, the first pair of electrode structures 22A and 22B are electrically connected to a ground line GND1 and a power supply line VDD1 so as to define a first capacitor 22A/B. Similarly, the second pair of electrode structures 22C and 22D are electrically connected to a ground line GND1 and a power supply line VDD1 so as to define a second capacitor 22C/D. The first and second capacitors 22A/B and 22C/D are electrically connected in parallel to the ground line GND1 and the power supply line VDD1 so that a first large-capacitance capacitor 28A is defined. Namely, the first large-capacitance capacitor 28A features a capacitance which is equivalent to the sum of capacitances of both the first and second capacitors 22A/B and 22C/D.

On the other hand, the third pair of electrode structures 22E and 22F are electrically connected to a ground line GND28 and a power supply line VDD2 so as to define a third capacitor 22E/F. Similarly, the fourth pair of electrode structures 22G and 22H are electrically connected to the ground line GND2 and the power supply line VDD2 so as to define a fourth capacitor 22G/H. The third and fourth capacitors 22E/F and 22G/H are electrically connected in parallel to the ground line GND2 and the power supply line VDD2 so that a second large-capacitance capacitor 28B is defined. Namely, the second large-capacitance capacitor 28B features a capacitance which is equivalent to the sum of capacitances of both the third and fourth capacitors 22E/F and 22G/H.

Figure 3:
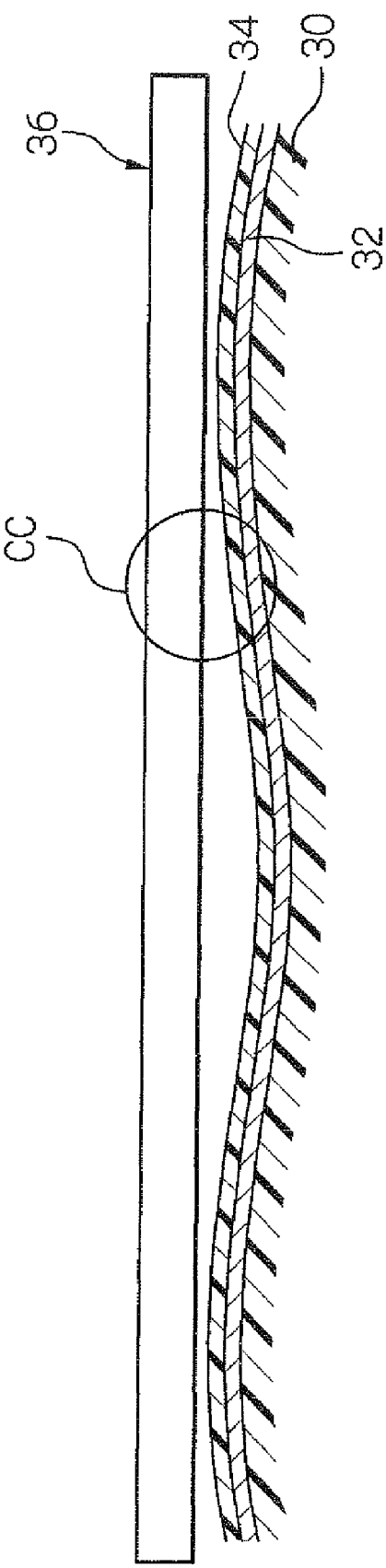
FIG. 3 is an explanatory view for explaining a process in which eight strip-like metal layers are formed in an insulating interlayer of the second prior art MIM capacitor arrangement.
Figure 4A:
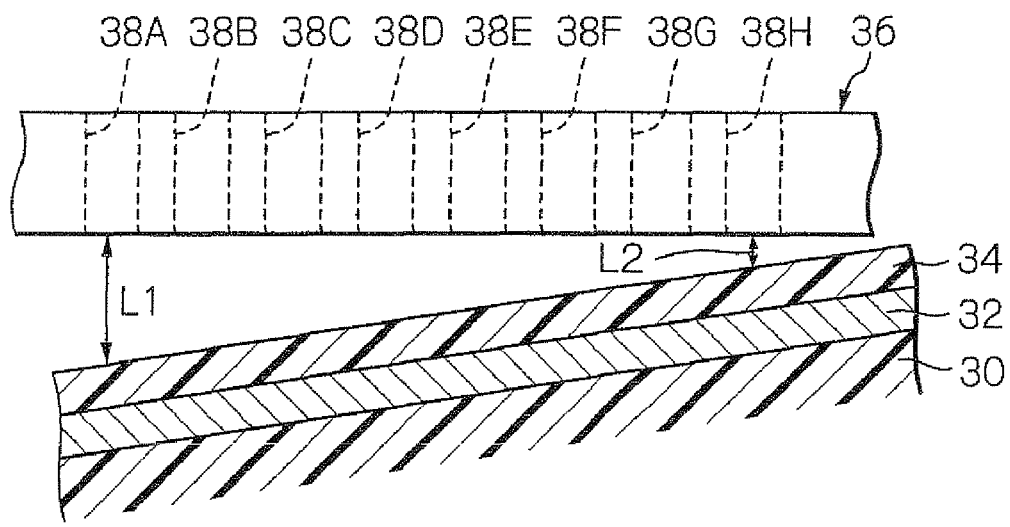
FIG. 4A is a partially-enlarged view of a portion encircled by a circular CC of FIG. 3.

In this second prior art MIM capacitor arrangement, although the first and second large-capacitance capacitors 28A and 28B should have substantially the same capacitance as each other, there may be an unacceptable variation between the capacitances of the first and second large-capacitance capacitors 28A and 28B, because the formation of the electrode structures 22A, 22B, 22C, 22D, 22E, 22F, 22G and 22H is inevitably subjected to a process fluctuation, as discussed with reference to FIGS. 3, 4A and AB below.

FIG. 3 shows a representative process in which the eight strip-like metal layers $24A_2$, $24B_2$, $24C_2$, $24D_2$, $24E_2$, $24F_2$, $24G_2$ and $24H_2$ are formed in the insulating interlayer of the multi-layered wiring construction.

Although not shown in FIG. 3, a lowermost wiring layer having a wiring layout pattern defined thereon is formed over a semiconductor substrate which defines a chip area on a silicon wafer. After the formation of the lowermost wiring layer, a silicon dioxide layer is formed as an insulating layer over the lowermost wiring layer. Then, the silicon dioxide layer is polished and planarized by using a chemical mechanical polishing (CMP) process, and the eight strip-like metal layers $24A_1$, $24B_1$, $24C_1$, $24D_1$, $24E_1$, $24F_1$, $24G_1$ and $24H_1$ are formed on the silicon dioxide layer by using a sputtering process, a photolithography process, an etching process, and so on.

After the formation of the eight strip-like metal layers $24A_1$ to $24H_1$, a silicon dioxide layer is further formed over the silicon dioxide layer concerned by using a chemical vapor deposition (CVD) process, and is polished and planarized by using a CMP process, resulting in the formation of the insulating interlayer having the eight strip-like metal layers $24A_1$ to $24H_1$.

Note, although the insulating interlayer having the eight strip-like metal layers $24A_1$ to $24H_1$ is subjected to the CMP process, a surface of the insulating interlayer concerned is inevitably undulated due to existence of the eight strip-like metal layers $24A_1$ to $24H_1$ formed therein.

After the formation of the insulating interlayer having the eight strip-like metal layers $24A_1$ to $24H_1$, a silicon dioxide layer 30 (FIG. 3) is formed as an insulating layer over the insulating interlayer having the eight strip-like metal layers $24A_1$ to $24H_1$, by using a CVD process. Then, although the silicon dioxide layer 30 is polished and planarized by using a CMP process, a surface of the silicon dioxide layer 30 is inevitably undulated due to the undulated surface of the insulating interlayer having the eight strip-like metal layers $24A_1$ to $24H_1$, as shown in FIG. 3. Note, in this drawing, the undulation of the silicon dioxide layer 30 is exaggeratedly illustrated.

After the formation of the silicon dioxide layer 30, a metal layer 32 is formed as an aluminum layer over the undulated surface of the silicon dioxide layer 30 by using a sputtering process, and then a photoresist layer 34 is formed over the metal layer 32. Subsequently, the photoresist layer 34 is subjected to a photolithography process for the formation of the eight strip-like metal layers $24A_2$ to $24H_2$.

In particular, first, a photomask 36 is positioned in place above the photoresist layer 34. Note, in FIG. 3, for the sake of convenience of illustration, although the photomask 36 is illustrated adjacent to the undulated surface of the silicon dioxide layer 30, in reality, it is further from the photoresist layer 34.

As shown in FIG. 4A which is a partially-enlarged view of a portion encircled by a circle CC of FIG. 3, the photomask 36 is formed with eight elongated rectangular openings 38A, 38B, 38C, 38D, 38E, 38F, 38G and 38G, which correspond to the respective eight strip-like metal layers $24A_2$ to $24H_2$.

Figure 4B:
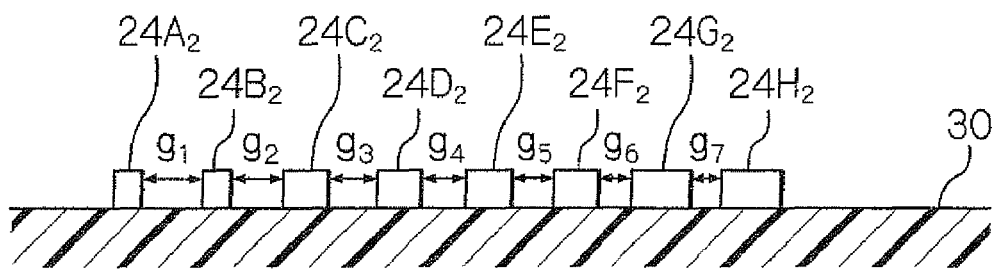
FIG. 4B is an explanatory view for explaining an irregularity of the strip-like metal layers formed by the process of FIG. 3.

After the positioning of the photomask 36, the photoresist layer 34 is subjected to a well-known exposure process in which strip-like area images, corresponding to the elongated rectangular openings 38A to 38H, are focused and projected on the photoresist layer 34. Namely, in the exposure process, strip-like areas are defined as exposed areas on the photoresist layer 34 by the openings 38A to 38H. Then, the photoresist layer 34 is developed and etched so that the exposed strip-like areas of the photoresist layer 34 are left on the metal layer 32 to thereby produce a photoresist mask. Subsequently, the metal layer 32 is etched by using the photoresist mask, resulting in the formation of the eight strip-like metal layers $24A_2$ to $24H_2$ on the silicon dioxide layer 30, as shown in FIG. 4B. Note, in FIG. 4B, although the surface of the silicon dioxide layer 30 is illustrated as a flat surface, it is microscopically undulated as shown in FIGS. 3 and 4A.

Next, although not shown in FIG. 4B, a silicon dioxide layer is further formed over the silicon dioxide layer 30 by using a CVD process, and is polished and planarized by a CMP process, resulting in the formation of the insulating interlayer having the eight strip-like metal layers $24A_2$ to $24H_2$. By repeating the aforesaid processes, the respective insulating interlayers having the eight strip-like metal layers $24A_3$ to $24H_3$ and $24A_4$ to $24H_4$ are formed in turn on the insulating interlayer having the eight strip-like metal layers $24A_2$ to $24H_2$.

Note, although the aforesaid description does not refer to how the via plugs 16A to 16E are formed, the formation of the via plugs 16A to 16E may be carried out in a well-known manner.

As shown in FIG. 4A, a distance between the silicon dioxide layer 30 and the photomask 36 is varied in accordance with the undulated surface of the silicon dioxide layer 30. Namely, in the example shown in FIG. 4A, a distance L1, which is measured between the silicon dioxide layer 30 and the photomask 36 at the elongated rectangular openings 38A, is larger than a distance L2 which is measured between the silicon dioxide layer 30 and the photomask 36 at the elongated rectangular openings 38H, and the distance between the silicon dioxide layer 30 and the photomask 36 is gradually decreased from the distance L1 toward the distance L2.

Thus, in the exposure process, the strip-like area images, corresponding to the elongated rectangular openings 38A to 38H, are defocused on the photoresist layer 34 in accordance with the variation of the distance between the silicon dioxide layer 30 and the photomask 36. In particular, the strip-like area image, projected on the photoresist layer 34 through the elongated rectangular opening 38A, is subjected to a maximum defocus, and the strip-like area image, projected on the photoresist layer 34 through the elongated rectangular opening 38H, is subjected to a minimum defocus. Thus, the strip-like metal layer $24A_2$ is formed so as to have a minimum width, and the strip-like metal layer $24H_2$ is formed so as to have a maximum width. Namely, the widths of the eight strip-like metal layers $24A_2$ to $24H_2$ become gradually larger in order, as exaggeratedly illustrated in FIG. 4B. In other words, gaps $g_1$, $g_2$, $g_3$, $g_4$, $g_5$, $g_6$ and $g_7$ between the two consecutive strip-like metal layers $24A_2$ to $24H_2$ become gradually narrower in order.

When it is assumed that the gaps $g_1$ to $g_7$ are gradually decreased in turns by a constant ratio P, the gaps $g_2$ to $g_7$ can be represented as follows:

$$g_2 = p^1 g_1$$

$$g_3 = p^2 g_1$$

$$g_4 = p^3 g_1$$

$$g_5 = p^4 g_1$$

$$g_6 = p^5 g_1$$

$$g_7 = p^6 g_1$$

As is apparent from the foregoing, when the formation of the insulating interlayer having the eight strip-like metal layers $24A_2$ to $24H_2$ is completed, the gaps $g_1$ to $g_7$ are filled with the dielectric material of silicon dioxide. Thus, it is possible to define four respective capacitors by a first pair of strip-like metal layers $24A_2$ and $24B_2$, a second pair of strip-like metal layers $24C_2$ and $24D_2$, a third pair of strip-like metal layers $24E_2$ and $24F_2$, and a fourth pair of strip-like metal layers $24G_2$ and $24H_2$.

When both the capacitor defined by the first pair of strip-like metal layers $24A_2$ and $24B_2$ and the capacitor defined by the second pair of strip-like metal layers $24C_2$ and $24D_2$ are electrically connected in parallel so as to define a first parallel-connected capacitor, and when both the capacitor defined by the third pair of strip-like metal layers $24E_2$ and $24F_2$ and the capacitor defined by the second pair of strip-like metal layers $24G_2$ and $24H_2$ are electrically connected in parallel so as to define a second parallel-connected capacitor, respective capacitances $C_1$ and $C_2$ of the first and second parallel-connected capacitors are represented as follows:

$$C_1 = \in S/[(1+p^2)g1]$$

$$C_2 = \in S/[(p^4+p^6)g1]$$

Herein: $\in$ is a permittivity of the dielectric material with which the gaps $g_1$ to $g_7$ are filled; and S is an opposed area between the two consecutive strip-like metal layers $24A_2$ and $24B_2$; $24C_2$ and $24D_2$; $24E_2$ and $24F_2$; and $24G_2$ and $24H_2$.

Accordingly, a ratio of $C_1$ to $C_2$ is calculated as follows:

$$\begin{aligned} C_1/C_2 &= [\varepsilon S/[(1+p^2)g1]]/[\varepsilon S/[(p^4+p^6)g1]] \\ &= [1/[(1+p^2)]]/[1/[(p^4+p^6)1]] \\ &= (p^4+p^6)/(1+p^2) \\ &= p^4(1+p^2)/(1+p^2) \\ &= p^4 \end{aligned}$$

For example, when it is assumed that the gaps $g_1$, $g_2$, $g_3$, $g_4$, $g_5$, $g_6$ and $g_7$ are gradually decreased in turn by 0.1%, i.e. when it is assumed that the constant ratio P is 0.999, the ratio $C_1/C_2$ is approximately 0.96. Note, of course, although the ratio $C_1/C_2$ should be ideally 1, in reality, the ratio $C_1/C_2$ cannot be 1 due to the process fluctuation as stated above. The larger the number of strip-like metal layers to be formed in the insulating interlayer, the larger the fluctuation of the ratio $C_1/C_2$.

Thus, it is very difficult or impossible to carry out the formation of the MIM capacitor arrangement so that capacitances of the MIM capacitors or large-capacitance capacitors 28A and 28B are substantially equivalent to each other.

First Embodiment

FIGS. 5, 6, 7 and 8 show a first embodiment of a semiconductor device including an MIM capacitor arrangement according to the present invention.

Figure 5:
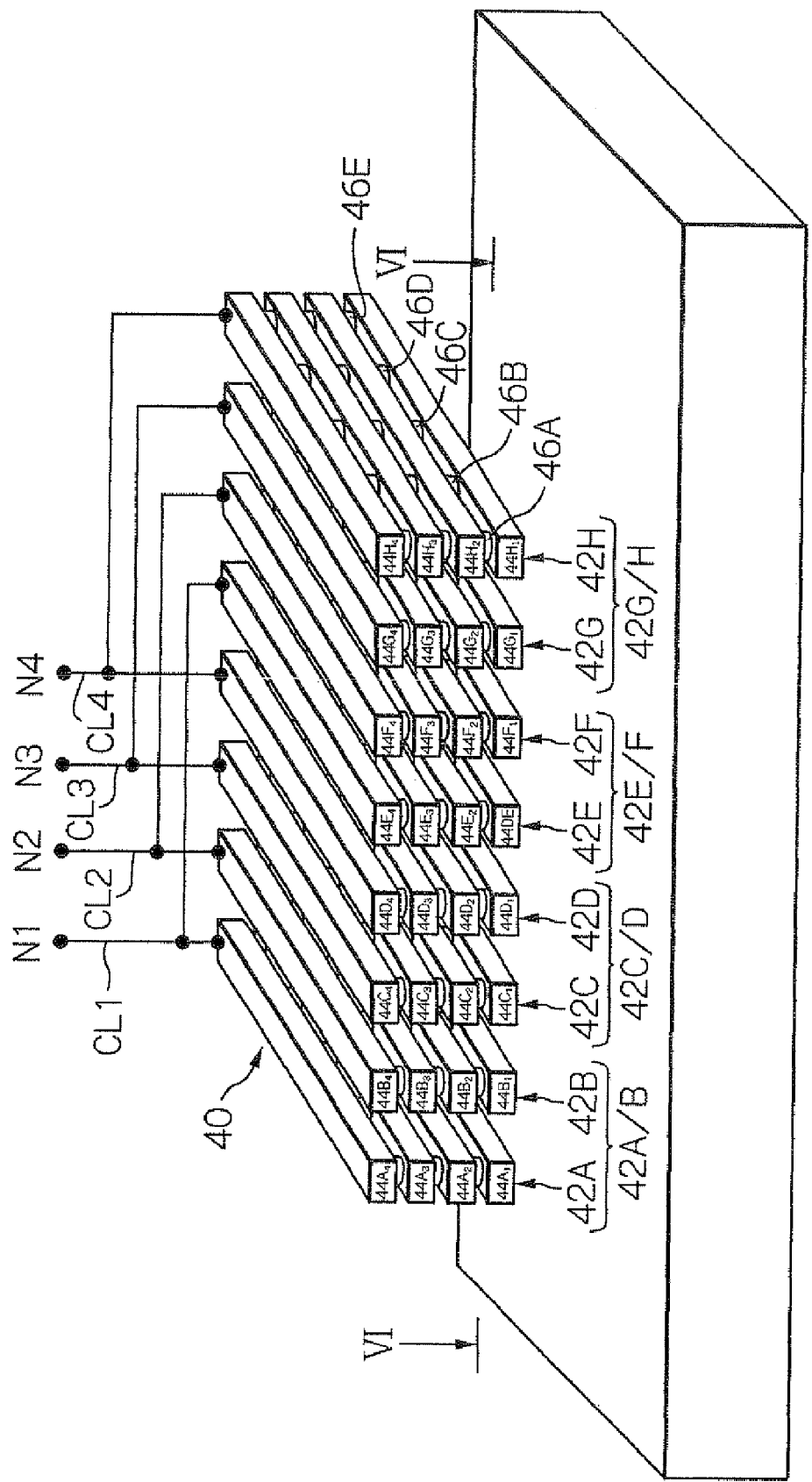
FIG. 5 is a schematic perspective view of a first embodiment of a semiconductor device including an MIM capacitor arrangement according to the present invention.
Figure 6:
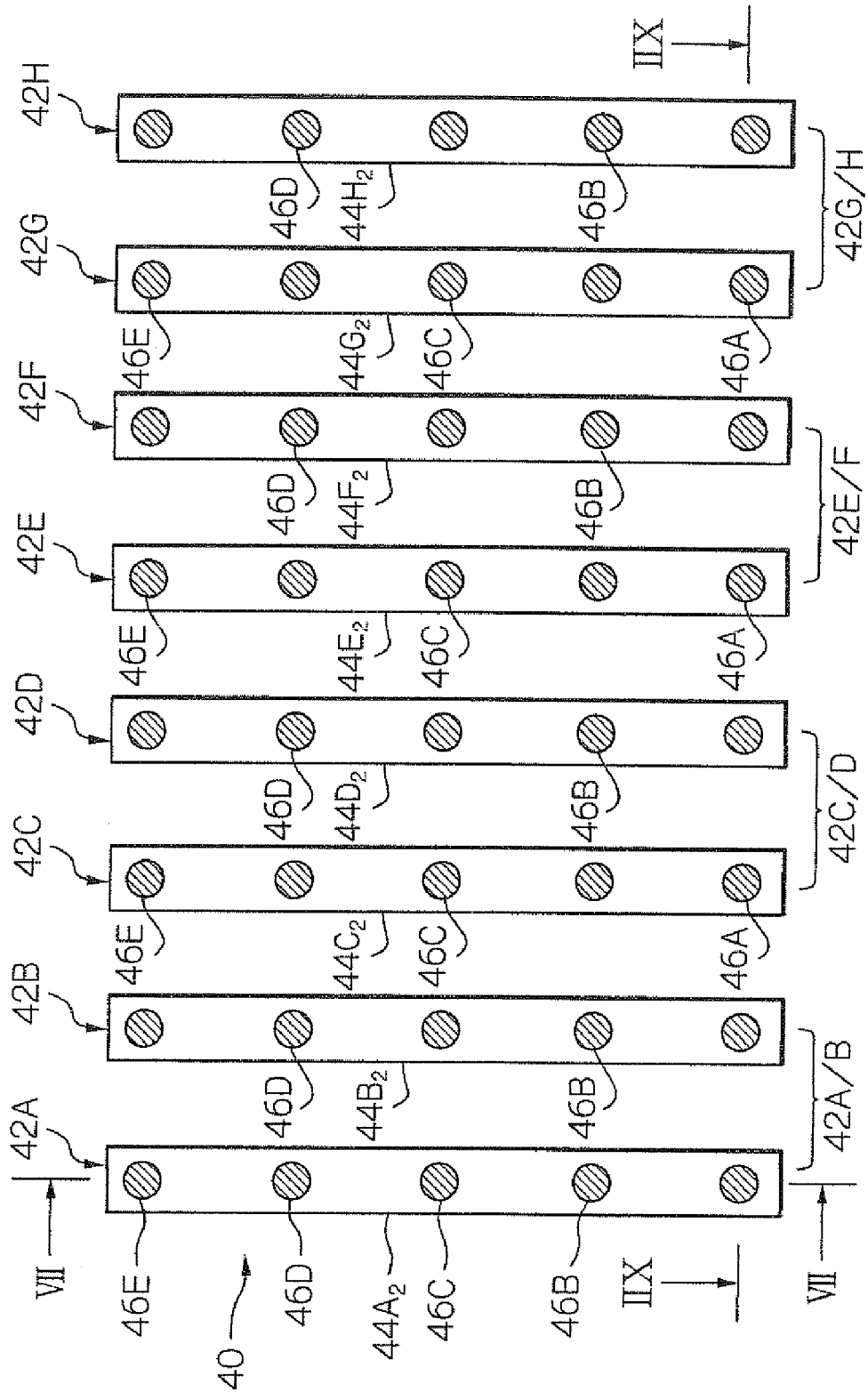
FIG. 6 is a cross-sectional view of the MIM capacitor arrangement taken along the VI-VI line of FIG. 5.
Figure 7:
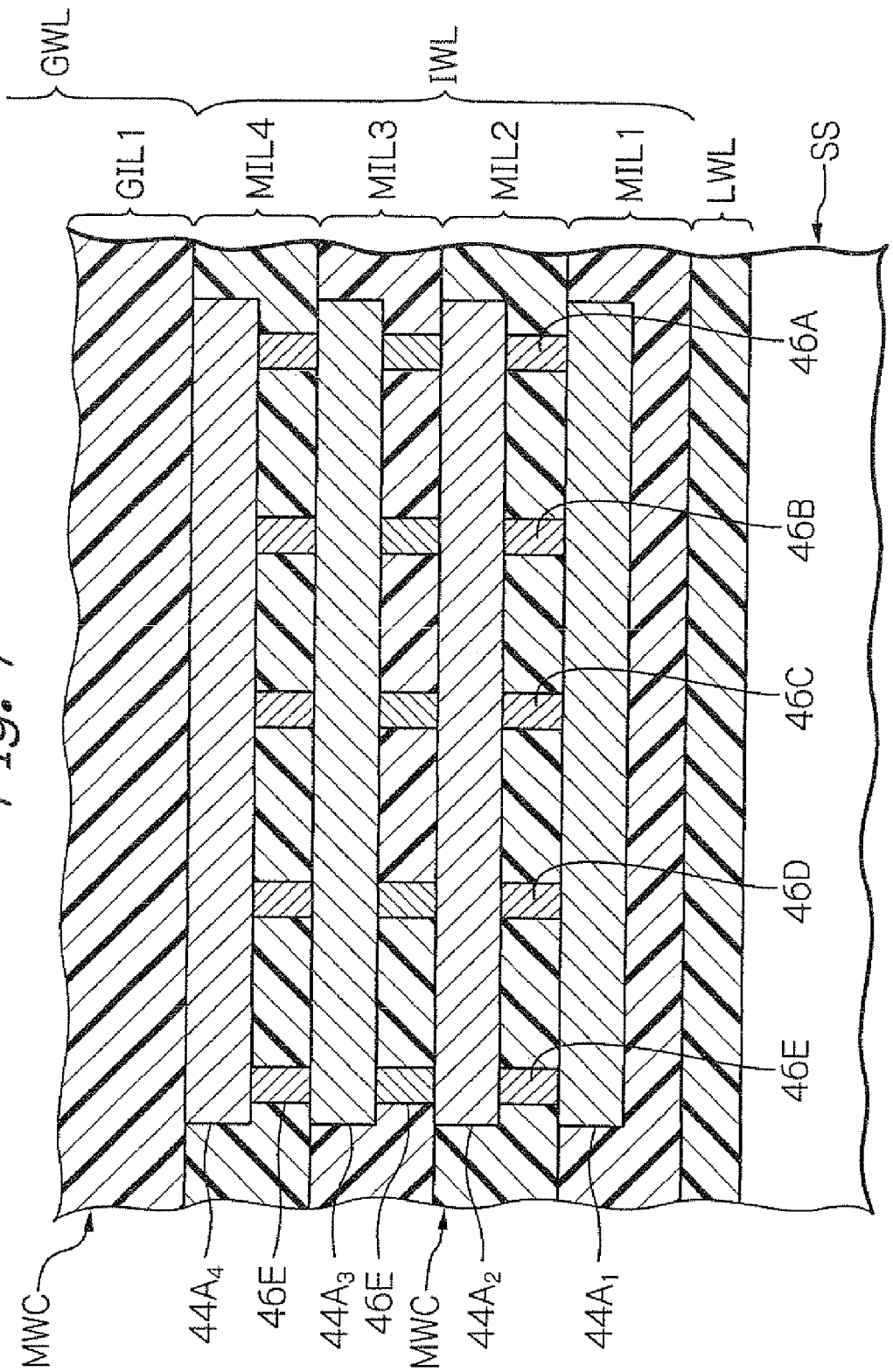
FIG. 7 is a cross-sectional view of the MIM capacitor arrangement taken along the VII-VII line of FIG. 6.
Figure 8:
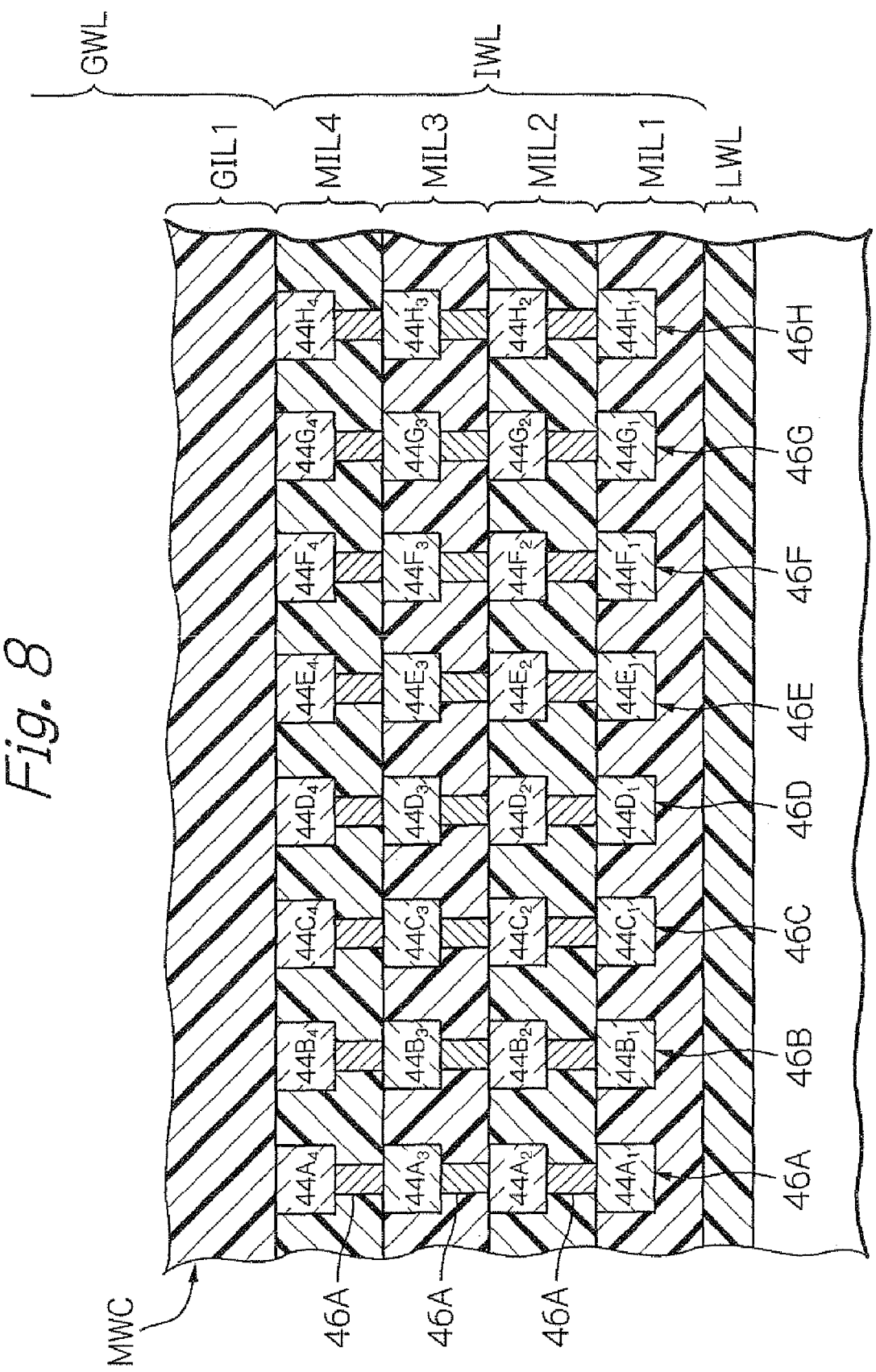
FIG. 8 is a cross-sectional view of the MIM capacitor arrangement taken along the IIX-IIX line of FIG. 6.

In FIGS. 5, 7 and 8, reference SS indicates a semiconductor substrate which defines one of chip areas on a silicon wafer, and only a part of the semiconductor substrate SS is illustrated. Although not shown in FIGS. 5 and 6, after a semiconductor device is produced in the semiconductor substrate SS by processing the silicon wafer, using various well-known methods, a multi-layered wiring construction MWC (FIGS. 7 and 8) is formed over the semiconductor substrate SS.

As shown in FIGS. 7 and 8, the multi-layered wiring construction MWC includes a lowermost wiring layer LWL formed over the semiconductor substrate SS, an intermediate wiring layer IWL formed over the lowermost wiring layer LWL, and a global wiring layer GWL formed over the intermediate wiring Layer IWL. In this embodiment, the intermediate wiring layer IWL includes four insulating interlayers MIL1, MIL2, MIL3 and MIL4 formed over the lowermost insulating layer LL in order, and the global wiring layer GWL includes a plurality of insulating interlayers formed over the intermediate wiring layer IWL in turn. Note, in FIGS. 7 and 8, only one of insulating interlayers of the global wiring layer GWL is illustrated and indicated by reference GIL1.

Although not shown in FIGS. 7 and 8, the lowermost wiring layer LWS has a circuit layout pattern formed thereon, and the circuit layout pattern is electrically connected to electrode pads and various active regions, defined on a surface of the chip area of semiconductor device, through the intermediary of contact plugs formed in the lowermost wiring layer. Also, in the intermediate wiring layer IWL, each of the insulating interlayers MIL1 to MIL4 has a circuit layout pattern formed thereon, and the circuit layout patterns are electrically connected to each other through the intermediary of via plugs formed in each of the insulating interlayers MIL2 to MIL4. Similarly, in the global wiring layer GWL, each of the insulating interlayers (GIL1) has a circuit layout pattern formed thereon, and the circuit layout patterns are electrically connected to each other through the intermediary of via plugs formed in each of the insulating interlayers (GIL1).

The formation of the circuit layout patterns on the lowermost wiring layer LWL is carried out in accordance with a first design rule. Also, in the intermediate wiring layer IWL, the formation of the respective circuit layout patterns on the insulating interlayers is carried out in accordance with a second design rule. Further, in the global wiring layer GWL, the formation of the respective circuit layout patterns on the insulating interlayers is carried out in accordance with a third design rule. Minimum widths of conductive lines of the circuit layout patterns are different from each other in accordance with the first, second and third design rules. Namely, the minimum width of the conductive lines in the first design rule is smaller than that in the second design rule, and the minimum width of the conductive lines in the second design rule is smaller than that in the third design rule.

In this embodiment, as is apparent from FIGS. 7 and 8, the MIM capacitor arrangement 40 is established in the intermediate wiring layer IWL, which is governed by the second design rule. As best shown in FIGS. 5 and 6, the MIM capacitor arrangement 40 includes four pairs of electrode structures: a first pair of electrode structures 42A and 42B; a second pair of electrode structures 42C and 42D, a third pair of electrode structures 42E and 42F, and a fourth pair of electrode structures 42G and 42H.

The electrode structures 42A, 42B, 42C, 42D, 42E, 42F, 42G and 42H are substantially identical to each other, and are arranged in parallel with each other at regular intervals, as shown in FIGS. 5 and 6.

The electrode structure 42A includes four strip-like metal layers $44A_1$, $44A_2$, $44A_3$ and $44A_4$ formed in the respective insulating interlayers MIL1, MIL2, MIL3 and MIL4 of the intermediate wiring layer IWL (FIGS. 7 and 8), and via plugs 46A, 46B, 46C, 46D and 46E formed in each of the insulating interlayers MIL2, MIL3 and MIL4 (FIGS. 7 and 8) so that the strip-like metal layers $44A_1$, $44A_2$, $44A_3$ and $44A_4$ are electrically connected to each other.

The electrode structure 42B includes four strip-like metal layers $44B_1$, $44B_2$, $44B_3$ and $44B_4$ formed in the respective insulating interlayers MIL1, MIL2, MIL3 and MIL4 of the intermediate wiring layer IWL, and via plugs 46A, 46B, 46C, 46D and 46E formed in each of the insulating interlayers MIL2, MIL3 and MIL4 so that the strip-like metal layers $44B_1$, $44B_2$, $44B_3$ and $44B_4$ are electrically connected to each other.

The electrode structure 42C includes four strip-like metal layers $44C_1$, $44C_2$, $44C_3$ and $44C_4$ formed in the respective insulating interlayers MIL1, MIL2, MIL3 and MIL4 of the intermediate wiring layer IWL, and via plugs 46A, 46B, 46C, 46D and 46E formed in each of the insulating interlayers MIL2, MIL3 and MIL4 so that the strip-like metal layers $44C_1$, $44C_2$, $44C_3$ and $44C_4$ are electrically connected to each other.

The electrode structure 42D includes four strip-like metal layers $44D_1$, $44D_2$, $44D_3$ and $44D_4$ formed in the respective insulating interlayers MIL1, MIL2, MIL3 and MIL4 of the intermediate wiring layer IWL, and via plugs 46A, 46B, 46C, 46D and 46E formed in each of the insulating interlayers MIL2, MIL3 and MIL4 so that the strip-like metal layers $44D_1$, $44D_2$, $44D_3$ and $44D_4$ are electrically connected to each other.

The electrode structure 42E includes four strip-like metal layers $44E_1$, $44E_2$, $44E_3$ and $44E_4$ formed in the respective insulating interlayers MIL1, MIL2, MIL3 and MIL4 of the intermediate wiring layer IWL, and via plugs 46A, 46B, 46C, 46D and 46E formed in each of the insulating interlayers MIL2, MIL3 and MIL4 so that the strip-like metal layers $44E_1$, $44E_2$, $44E_3$ and $44E_4$ are electrically connected to each other.

The electrode structure 42F includes four strip-like metal layers $44F_1$, $44F_2$, $44F_3$ and $44F_4$ formed in the respective insulating interlayers MIL1, MIL2, MIL3 and MIL4 of the intermediate wiring layer IWL, and via plugs 46A, 46B, 46C, 46D and 46E formed in each of the insulating interlayers MIL2, MIL3 and MIL4 so that the strip-like metal layers $44F_1$, $44F_2$, $44F_3$ and $44F_4$ are electrically connected to each other.

The electrode structure 42G includes four strip-like metal layers $44G_1$, $44G_2$, $44G_3$ and $44G_4$ formed in the respective insulating interlayers MIL1, MIL2, MIL3 and MIL4 of the intermediate wiring layer IWL, and via plugs 46A, 46B, 46C, 46D and 46E formed in each of the insulating interlayers MIL2, MIL3 and MIL4 so that the strip-like metal layers $44G_1$, $44G_2$, $44G_3$ and $44G_4$ are electrically connected to each other.

The electrode structure 42H includes four strip-like metal layers $44H_1$, $44H_2$, $44H_3$ and $44H_4$ formed in the respective insulating interlayers MIL1, MIL2, MIL3 and MIL4 of the intermediate wiring layer IWL, and via plugs 46A, 46B, 46C, 46D and 46E formed in each of the insulating interlayers MIL2, MIL3 and MIL4 so that the strip-like metal layers $44H_1$, $44H_2$, $44H_3$ and $44H_4$ are electrically connected to each other.

As shown in FIG. 5, the first pair of electrode structures 42A and 42B are electrically connected to respective conductive lines CL1 and CL2 having nodes N1 and N2, so that a first capacitor 42A/B is defined. Namely, by generating a potential difference between the nodes N1 and N2, the first pair of electrode structures 42A and 42B serves as the first capacitor 42A/B. Also, the second pair of electrode structures 42C and 42D are electrically connected to respective conductive lines CL3 and CL4 having nodes N3 and N4, so that a second capacitor 42C/D is defined. Namely, by generating a potential difference between the nodes N3 and N4, the second pair of electrode structures 42C and 42D serves as the second capacitor 42C/D.

Similar to the first pair of electrode structures 42A and 42B, the third pair of electrode structures 42E and 42F are electrically connected to the respective conductive lines CL1 and CL2 having the nodes N1 and N2, so that a third capacitor 42E/F is defined. Namely, the first and third capacitors 42A/B and 42E/F are electrically connected in parallel with respect to the conductive lines CL1 and CL2 so that a first large-capacitance capacitor is defined. This first large-capacitance capacitor (42A/B and 42E/F) features a capacitance which is equivalent to the sum of capacitances of both the first and third capacitors 12A/B and 12E/F.

Similar to the second pair of electrode structures 42C and 42D, the fourth pair of electrode structures 42G and 42H are electrically connected to the respective conductive lines CL3 and CL4 having the nodes N3 and N4, so that a fourth capacitor 42G/H is defined. Namely, the second and fourth capacitors 42C/D and 42G/H are electrically connected in parallel with respect to the conductive lines CL3 and CL4, so that a second large-capacitance capacitor is defined. This second large-capacitance capacitor (42C/D and 42G/H) features a capacitance which is equivalent to the sum of capacitances of both the second and fourth capacitors 12C/D and 12G/H.

The MIM capacitor arrangement 40 per se may be established in substantially the same manner as explained with reference to FIGS. 3, 4A and 4B.

In particular, the lowermost wiring layer LWL having the wiring layout pattern defined thereon is formed on the chip area or semiconductor substrate SS.

After the formation of the lowermost wiring layer LWL, a silicon dioxide layer is formed as an insulating layer over the lowermost wiring layer LWL. Then, the silicon dioxide layer is polished and planarized by using a CMP process, and a metal layer is formed over the polished silicon dioxide layer by using a sputtering process. Subsequently, the metal layer is patterned by using a photolithography process and an etching process so that the eight strip-like metal layers $44A_1$, $44B_1$, $44C_1$, $44D_1$, $44E_1$, $44F_1$, $44G_1$ and $44H_1$ are formed on the silicon dioxide layer.

After the formation of the eight strip-like metal layers $44A_1$ to $44H_1$, a silicon dioxide layer is further formed over the silicon dioxide layer concerned by using a CVD process, and is polished and planarized by using a CMP process, resulting in the formation of the insulating interlayer MIL1 having the eight strip-like metal layers $44A_1$ to $44H_1$ formed therein.

Next, a silicon dioxide layer is formed over the insulating interlayer MIL1, and the via plugs 46A, 46B, 46C, 46D and 46E are formed in the silicon dioxide layer by using a photolithography process, an etching process, a sputtering process, a CMP process, and so on. Subsequently, a metal layer is formed over the silicon dioxide layer concerned by using a sputtering process, and is patterned by using a photolithography process and an etching process so that the eight strip-like metal layers $44A_2$, $44B_2$, $44C_2$, $44D_2$, $44E_2$, $44F_2$, $44G_2$ and $44H_2$ are formed on the silicon dioxide layer.

After the formation of the eight strip-like metal layers $44A_2$ to $44H_2$, a silicon dioxide layer is further formed over the silicon dioxide layer concerned by using a CVD process, and is polished and planarized by using a CMP process, resulting in the formation of the insulating interlayer MIL2 having the eight strip-like metal layers $44A_2$ to $44H_2$ formed therein.

Then, the formation of the respective insulating interlayers MIL3 and MIL4 having the eight strip-like metal layers $44A_3$ to $44H_3$ and $44A_4$ to $44H_4$ formed therein is carried out in substantially the same manner as the formation of the insulating interlayer MIL2 having the eight strip-like metal layers $44A_2$ to $44H_2$. Note, after the formation of the intermediate wiring layer IWL is completed, the formation of the global wiring layer GWL is carried out by using various well-known methods.

Assuming that the formation of the eight strip-like metal layers $44A_2$ to $44H_2$ is carried out under the same conditions as explained with reference to FIGS. 3, 4A and 4B, the widths of the eight strip-like metal layers $44A_2$ to $44H_2$ become gradually larger in order. In other words, similar to the case of FIG. 4B, gaps ($g_1$, $g_2$, $g_3$, $g_4$, $g_5$, $g_6$ and $g_7$) between the two consecutive strip-like metal layers $44A_2$ and $44B_2$; $44B_2$ and $44C_2$; $44C_2$ and $44D_2$; $44D_2$ and $44E_2$; $44E_2$ and $44F_2$; $44F_2$ and $44G_2$; and $44G_2$ and $44H_2$) become gradually narrower in order.

In this case, it is possible to define four respective capacitors by a first pair of strip-like metal layers $44A_2$ and $44B_2$, a second pair of strip-like metal layers $44C_2$ and $44D_2$, a third pair of strip-like metal layers $44E_2$ and $44F_2$, and a fourth pair of strip-like metal layers $44G_2$ and $44H_2$.

When both the capacitor defined by the first pair of strip-like metal layers $44A_2$ and $44B_2$ and the capacitor defined by the third pair of strip-like metal layers $44E_2$ and $44F_2$ are electrically connected in parallel so as to define a first parallel-connected capacitor, and when both the capacitor defined by the third pair of strip-like metal layers $44E_2$ and $44F_2$ and the capacitor defined by the second pair of strip-like metal layers $44G_2$ and $44H_2$ are electrically connected in parallel so as to define a second parallel-connected capacitor, respective capacitances $C_F$ and $C_S$ of the first and second parallel-connected capacitors are represented as follows:

$$C_F = \in S/[(g_1 + p^4 g_1)]$$

$$C_S = \in S/[(p^2 g_1 + p^6 g_1)]$$

Of course, in these equations, it is assumed that the permittivity $\in$ of the dielectric material (FIG. 4B) is equivalent to a permittivity of the insulating interlayer MIL2, and it is assumed that the opposed area S between the two consecutive strip-like metal layers $24A_2$ and $24B_2$; $24C_2$ and $24D_2$; $24E_2$ and $24F_2$; and $24G_2$ and $24H_2$ (FIG. 4B) is equivalent to an opposed area between the two consecutive strip-like metal layers $44A_2$ and $44B_2$; $44C_2$ and $44D_2$; $44E_2$ and $44F_2$; and $44G_2$ and $44H_2$.

Accordingly, a ratio of $C_F$ to $C_S$ is calculated as follows:

$$\begin{aligned}
C_F/C_S &= [\varepsilon S/[(g_1 + p^4 g_1)]]/[\varepsilon S/[(p^2 g_1 + p^6 g_1)]] \\
&= [1/[(g_1 + p^4 g_1)]]/[1/[(p^2 g_1 + p^6 g_1)]] \\
&= (p^2 + p^6)/(1 + p^4) \\
&= p^2(1 + p^2)/(1 + p^2) \\
&= p^2
\end{aligned}$$

Similar to the case of FIG. 4B, when it is assumed that the gaps ($g_1$, $g_2$, $g_3$, $g_4$, $g_5$, $g_6$ and $g_7$) are gradually decreased in turn by 0.1%, i.e. when it is assumed that the constant ratio P is 0.999, the ratio $C_F/C_S$ is approximately 0.998.

It is found that the ratio $C_F/C_S$ is larger than the aforesaid ratio $C_1/C_2$ (0.996) by approximately 0.2. Namely, the capacitance ratio $C_F/C_S$ according to the present invention is improved by approximately 0.2% in comparison with the aforesaid prior art capacitance ratio $C_1/C_2$ (FIG. 4A). This improvement is more remarkable as the number of strip-like metal layers to be formed in the insulating interlayer becomes larger. In short, according to the present invention, it is possible to more diminish an influence of process fluctuations in comparison with the second prior art MIM arrangement shown in FIG. 3.

In the above-mentioned first embodiment, when the respective potential differences are generated between the nodes N1 and N2 and between the nodes N3 and N4, the potential differences may be independently controlled. Namely, the first large-capacitance capacitor (42A/B and 42E/F) and the second large-capacitance capacitor (42C/D and 42G/H) may be independently controlled.

Also, for example, when a high voltage and a low voltage are applied to the respective nodes N1 and N2 to generate the potential difference therebetween, it is preferable to apply a low voltage and a high voltage to the respective nodes N3 and N4, because it is possible to effectively suppress production of respective parasitic capacitances between the electrode structures 42B and 42C and between the electrode structures 42D and 42E. Namely, the respective low voltages are applied to the two adjacent electrodes 42B and 42C, and the respective high voltages are applied to the two adjacent electrodes 42D and 42E, resulting in the suppression of the production of the respective parasitic capacitances between the electrode structures 42B and 42C and between the electrode structures 42D and 42E. Note, of course, when a low voltage and a high voltage are applied to the respective nodes N1 and N2, a high voltage and a low voltage should be applied to the respective nodes N3 and N4.

In the above-mentioned first embodiment, although the MIM capacitor arrangement 40 is established in the intermediate wiring layer IWL which is governed by the aforesaid second design rule, it may be established in the global wiring layer GNL which is governed by the aforesaid third design rule in which the minimum width of the conductive lines is larger than that in the second design rule.

In the above-mentioned first embodiment, although the four strip-like metal layers ($44A_1$ to $44A_4$; $44B_1$ to $44B_4$; $44C_1$ to $44C_4$; $44D_1$ to $44D_4$; $44E_1$ to $44E_4$; $44F_1$ to $44F_4$; $44G_1$ to $44G_4$; $44H_1$ to $44H_4$) are directly connected to each other by the via plugs 46A, 46B, 46C, 46D and 46E intervened therebetween, the electrical connection between the four strip-like metal layers may be carried out in another manner. For example, the four strip-like metal layers may have respective conductive lines extended therefrom, and these conductive lines may be suitably connected to the conductive line C1.

Second Embodiment

Figure 9:
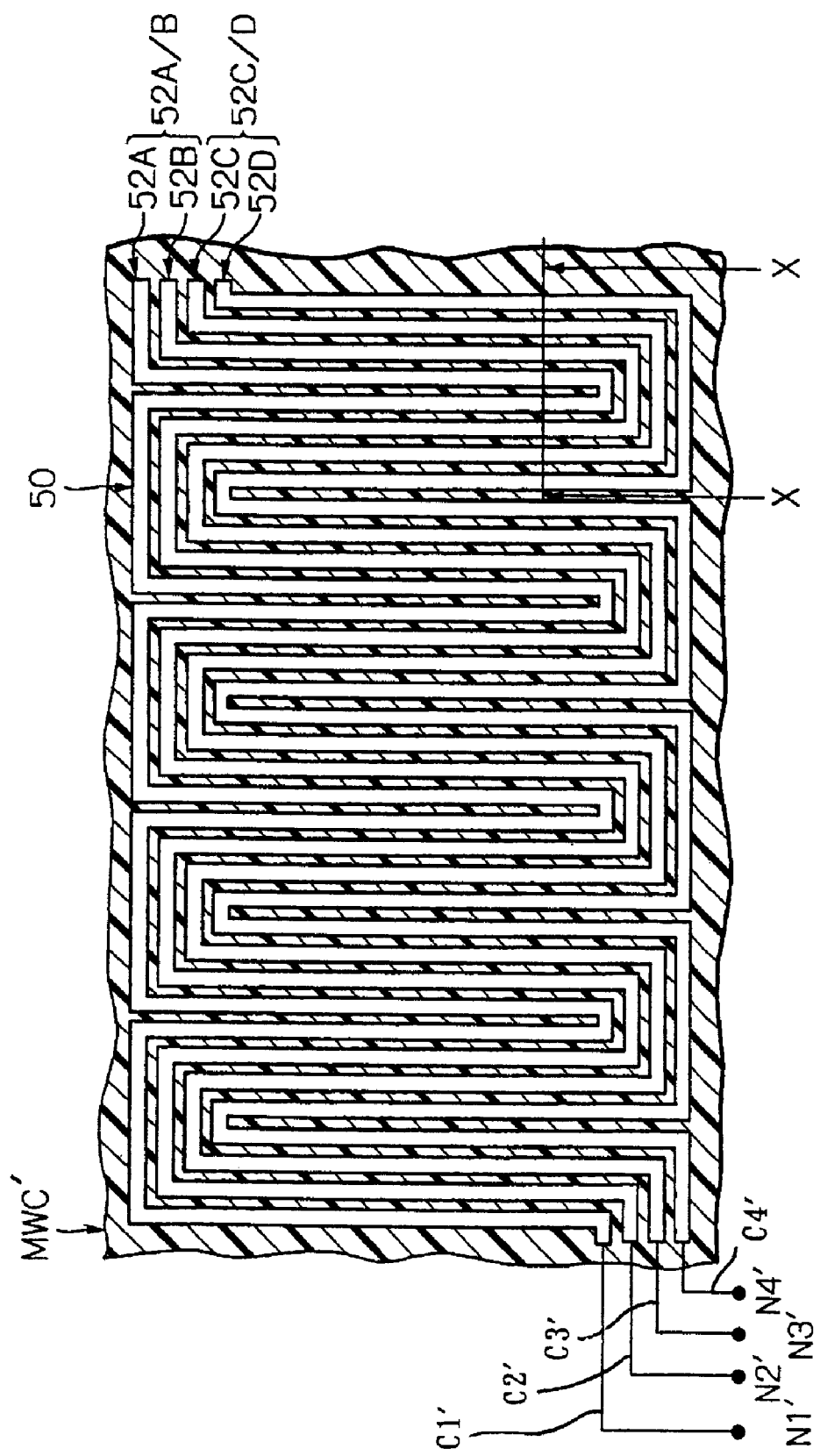
FIG. 9 is a cross-sectional view taken along the IX-IX line of FIG. 10, showing a second embodiment of a semiconductor device including an MIM capacitor arrangement according to the present invention.

FIGS. 9 and 10 show a second embodiment of an semiconductor device including an MIM capacitor arrangement according to the present invention. Note, FIG. 9 shows a cross-section of the MIM capacitor arrangement taken along the IX-IX line of FIG. 10, and FIG. 10 shows a cross-section of the MIM capacitor arrangement taken along the X-X line of FIG. 9.

In FIG. 10, reference SS' indicates a semiconductor substrate which defines one of chip areas on a silicon wafer, and only a part of the semiconductor substrate SS' is illustrated. Although not shown in FIGS. 9 and 10, after a semiconductor device is produced in the semiconductor substrate SS' by processing the silicon wafer, using various well-known methods, a multi-layered wiring construction MWC' is formed over the semiconductor substrate SS'.

As shown in FIG. 10, the multi-layered wiring construction MWC' includes a lowermost wiring layer LWL' formed over the semiconductor substrate SS', and an intermediate wiring layer IWL' formed over the lowermost wiring layer LWL'. Note, although not illustrated in FIG. 10, a global wiring layer is formed over the intermediate wiring Layer IWL'.

Similar to the above-mentioned first embodiment, the MIM capacitor arrangement, generally indicated by reference 50, is established in the intermediate wiring layer IWL'.

The intermediate wiring layer IWL' includes a plurality of insulating interlayers, only two of which are illustrated and indicated by references MIL1' and MIL2' in FIG. 10.

The MIM capacitor arrangement 50 includes two pairs of meandering electrode structures: a first pair of meandering electrode structures 52A and 52B; and a second pair of meandering electrode structures 52C and 52D.

The meandering electrode structure 52A includes meandering metal layers (only one of which is illustrated and indicated by reference 54A) formed in the respective insulating interlayers (MIL1', MIL2' . . . ) of the intermediate wiring layer IWL', and via plugs 56A formed in each of the insulating interlayers (except for the lowermost insulating interlayer MIL1') so as to electrically connect the strip-like metal layers (54A) to each other.

The meandering electrode structure 52B includes meandering metal layers (only one of which is illustrated and indicated by reference 54B) formed in the respective insulating interlayers (MIL1', MIL2' . . . ) of the intermediate wiring layer IWL', and via plugs 56B formed in each of the insulating interlayers (except for the lowermost insulating interlayer MIL1') so as to electrically connect the strip-like metal layers (54B) to each other.

The meandering electrode structure 52C includes meandering metal layers (only one of which is illustrated and indicated by reference 54C) formed in the respective insulating interlayers (MIL1', MIL2' . . . ) of the intermediate wiring layer IWL', and via plugs 56C formed in each of the insulating interlayers (except for the lowermost insulating interlayer MIL1') so as to electrically connect the strip-like metal layers (54C) to each other.

The meandering electrode structure 52D includes meandering metal layers (only one of which is illustrated and indicated by reference 54D) formed in the respective insulating interlayers (MIL1', MIL2' . . . ) of the intermediate wiring layer IWL', and via plugs 56D formed in each of the insulating interlayers (except for the lowermost insulating interlayer MIL1') so as to electrically connect the strip-like metal layers (54C) to each other.

In this second embodiment, the MIM capacitor arrangement 50 may be established as follows:

First, the lowermost wiring layer LWL' having the wiring layout pattern defined thereon is formed on the chip area or semiconductor substrate SS'.

After the formation of the lowermost wiring layer LWL', a silicon dioxide layer is formed as an insulating layer over the lowermost wiring layer LWL'. Then, the silicon dioxide layer is polished and planarized by using a CMP process, and a metal layer is formed over the polished silicon dioxide layer by using a sputtering process. Subsequently, the metal layer is patterned by using a photolithography process and an etching process so that the four meandering metal layers 54A, 54B, 54C and 54D are formed on the silicon dioxide layer.

After the formation of the four meandering metal layers 54A, 54B, 54C and 54D, a silicon dioxide layer is further formed over the silicon dioxide layer concerned by using a CVD process, and is polished and planarized by using a CMP process, resulting in the formation of the insulating interlayer MIL1' having the four meandering metal layers 54A, 54B, 54C and 54D formed therein.

Next, a silicon dioxide layer is formed over the insulating interlayer MIL1', and the via plugs 56A, 56B, 56C and 56D are formed in the silicon dioxide layer by using a photolithography process, an etching process, a sputtering process, a CMP process, and so on. Subsequently, a metal layer is formed over the silicon dioxide layer concerned by using a sputtering process, and is patterned by using a photolithography process and an etching process so that the four meandering metal layers (not shown in FIG. 10) are formed on the silicon dioxide layer concerned. Thereafter, a silicon dioxide layer is further formed over the silicon dioxide layer concerned by using a CVD process, and is polished and planarized by using a CMP process, resulting in the formation of the insulating interlayer MIL2' having the four meandering metal layers formed therein.

The other insulating interlayers having the four meandering metal layers are further formed in order over the insulating interlayer MIL2' in substantially the same manner as the insulating interlayer MIL2', resulting in the formation of the intermediate wiring layer IWL'. Thereafter, the global wiring layer is formed over the intermediate wiring layer IWL' by using various well-known methods.

In this second embodiment, as is apparent from FIGS. 9 and 10, the meandering metal layers 54A and 54D are configured so as to be substantially identical to each other, and the meandering metal layers 54B and 54C are configured so as to be substantially identical to each other. Also, the meandering metal layers 54A, 54B, 54C and 54D are arranged so as to maintain a parallel relationship with respect to each other, and are spaced from each other at regular intervals. Further, an opposed area between the meandering metal layers 54A and 54B is substantially equivalent to an opposed area between the meandering metal layers 54C and 54D.

As shown in FIG. 10, the first pair of meandering electrode structures 52A and 52B are electrically connected to respective first and second conductive lines C1' and C2' having first and second nodes N1' and N2', so that a first large capacitance capacitor 52A/B is defined. Also, the second pair of meandering electrode structures 52C and 52D are electrically connected to respective third and fourth conductive lines C3' and C4' having third and fourth nodes N3' and to N4', so that a second large capacitance capacitor 52C/D is defined.

In forming each of the insulating interlayers (MIL1', MIL2'), although the insulating interlayer concerned is polished and planarized by the CMP process, a surface of the insulating interlayer concerned is inevitably undulated, as discussed above. As a result, a width of the meandering metal layers (54A, 54B, 45C and 54D) is microscopically varied due to the undulated insulating interlayer concerned. Thus, a capacitance of the first large-capacitance capacitor 52A/B cannot conform with a capacitance of the second large-capacitance capacitor 52C/D. However, according to the above-mentioned second embodiment, it is possible to make a degree of the unconformity between the capacitances of the first and second capacitors (52A and 52B; 52C and 52D) small, due to the meandering mature of the MIM capacitor arrangement 50.

In particular, for example, as is apparent from FIGS. 9 and 10, since both the first pair of meandering metal layers 54A and 54B and the second pair of meandering metal layers 54C and 54D are extended over the insulating interlayer MIL1' so as to be wholly close to each other, an influence based on the undulation of the insulating interlayer MIL1' may be equally exerted upon both the first pair of meandering metal layers 54A and 54B and the second pair of meandering metal layers 54C and 54D, whereby the degree of the unconformity between the capacitances of the first and second capacitors (52A and 52B; 52C and 52D) can be made small.

Further, according to the second embodiment, each of the first and second capacitors (52A and 52B; 52C and 52D) features a further large capacitance due to the meandering nature of the MIM capacitor arrangement.

Similar to the above-mentioned first embodiment, for example, when a high voltage and a low voltage are applied to the respective first and second nodes N1' and N2', it is preferable to apply a low voltage and a high voltage to the respective third and fourth nodes N3' and N4'. Also, when a low voltage and a high voltage are applied to the respective first and second nodes N1' and N2', it is preferable to apply a high voltage and a low voltage to the respective third and fourth nodes N3' and N4'. Thus, it is possible to effectively suppress production of a parasitic capacitance between the meandering electrode structures 52B and 52C.

Also, in the above-mentioned second embodiment, although the MIM capacitor arrangement 50 is established in the intermediate wiring layer IWL', it may be established in the global wiring layer.

Finally, it will be understood by those skilled in the art that the foregoing description is of preferred embodiments of the methods and devices, and that various changes and modifications may be made to the present invention without departing from the spirit and scope thereof.

The invention claimed is:

1. A semiconductor device comprising:
a semiconductor substrate;
a multi-layered wiring construction formed over said semiconductor substrate; and
a metal-insulator-metal capacitor arrangement established in said multi-layered wiring construction,
wherein said metal-insulator-metal capacitor arrangement includes first and second pairs of meandering electrode structures, said first and second pairs of meandering electrode structures being arranged in order so as to maintain a parallel relationship with respect to each other, and being spaced from each other at regular intervals,
said first pair of meandering electrode structures are connected to respective first and second conductive lines having first and second nodes, and
said second pair of meandering electrode structures are connected to respective third and fourth conductive lines having third and fourth nodes, voltages being independently applied to said first, second, third and fourth nodes.

2. The semiconductor device as set forth in claim 1, wherein each of said meandering electrode structures includes at least one meandering metal layer which is formed in an insulating interlayer included in said multi-layered wiring construction.

3. The semiconductor device as set forth in claim 1, wherein each of said meandering electrode structures includes at least two meandering metal layers, which are formed in respective insulating interlayers included in said multi-layered wiring construction, and which are electrically connected to each other.

4. The semiconductor device as set forth in claim 1, wherein the meandering electrode structure of said first pair of meandering electrode structures which is connected to said second conductive line, is adjacent to the meandering electrode structure of said second pair of meandering electrode structures which is connected to said third conductive line, and
the semiconductor device is configured for a high voltage and a low voltage being applied to said respective first and second nodes, and a low voltage and a high voltage being applied to said respective third and fourth nodes.

5. The semiconductor device as set forth in claim 1, wherein the meandering electrode structure of said first pair of meandering electrode structures which is connected to said second conductive line, is adjacent to the meandering electrode structure of said second pair of meandering electrode structures which is connected to said third conductive line, and
the semiconductor device is configured for a low voltage and a high voltage being applied to said respective first and second nodes, and a high voltage and a low voltage being applied to said respective third and fourth nodes.

* * * * *